US009905161B2

(12) United States Patent
Jeon

(10) Patent No.: US 9,905,161 B2
(45) Date of Patent: Feb. 27, 2018

(54) EMISSION DRIVER AND ORGANIC LIGHT EMITTING DISPLAY DEVICE HAVING THE SAME

(71) Applicant: SAMSUNG DISPLAY CO., LTD., Yongin-si, Gyeonggi-do (KR)

(72) Inventor: Jin Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 15/007,053

(22) Filed: Jan. 26, 2016

(65) Prior Publication Data

US 2016/0379558 A1    Dec. 29, 2016

(30) Foreign Application Priority Data

Jun. 29, 2015  (KR) .................. 10-2015-0091837

(51) Int. Cl.
| | |
|---|---|
| *G06F 3/038* | (2013.01) |
| *G09G 5/00* | (2006.01) |
| *G09G 3/3225* | (2016.01) |
| *G09G 3/3266* | (2016.01) |
| *G11C 19/18* | (2006.01) |
| *G11C 19/28* | (2006.01) |

(52) U.S. Cl.
CPC ......... *G09G 3/3225* (2013.01); *G09G 3/3266* (2013.01); *G11C 19/184* (2013.01); *G11C 19/28* (2013.01); *G09G 2310/0286* (2013.01); *G09G 2310/0291* (2013.01); *G09G 2310/08* (2013.01); *G09G 2320/0673* (2013.01)

(58) Field of Classification Search
CPC ............... G09G 3/3225; G09G 3/3266; G09G 2320/0673; G09G 2310/0291; G09G 2310/0286; G09G 2310/08; G11C 19/184; G11C 19/28
See application file for complete search history.

(56) References Cited

U.S. PATENT DOCUMENTS

2009/0262051 A1* 10/2009 Kim .................... G09G 3/3266
                                                           345/80
2010/0039455 A1*  2/2010 Ahn .................... G09G 3/3648
                                                          345/690

(Continued)

FOREIGN PATENT DOCUMENTS

KR    10-2013-0092814 A    8/2013

*Primary Examiner* — Ilana Spar
*Assistant Examiner* — Brent D Castiaux
(74) *Attorney, Agent, or Firm* — Lewis Roca Rothgerber Christie LLP

(57) ABSTRACT

An organic light emitting display device includes a display panel including a plurality of scan lines, a plurality of data lines, a plurality of emission lines, and a plurality of pixels, a scan driver configured to provide a scan signal to the pixels via the scan lines, a data driver configured to provide a data signal to the pixels via the data lines, an emission driver including a plurality of emission stages for providing an emission signal to the pixels via the emission lines, and a controller configured to control the scan driver, the data driver, and the emission driver, wherein each of the emission stages includes a plurality of sub-stages dependently connected to each other, and wherein one of the sub-stages is configured to output the emission signal to one of the emission lines.

19 Claims, 14 Drawing Sheets

(56) References Cited

U.S. PATENT DOCUMENTS

| | | | |
|---|---|---|---|
| 2010/0207968 A1* | 8/2010 | Kim | G09G 3/3266 345/691 |
| 2013/0222352 A1* | 8/2013 | Jeong | G09G 3/3266 345/205 |
| 2014/0192037 A1* | 7/2014 | Chung | G09G 3/2022 345/212 |

* cited by examiner

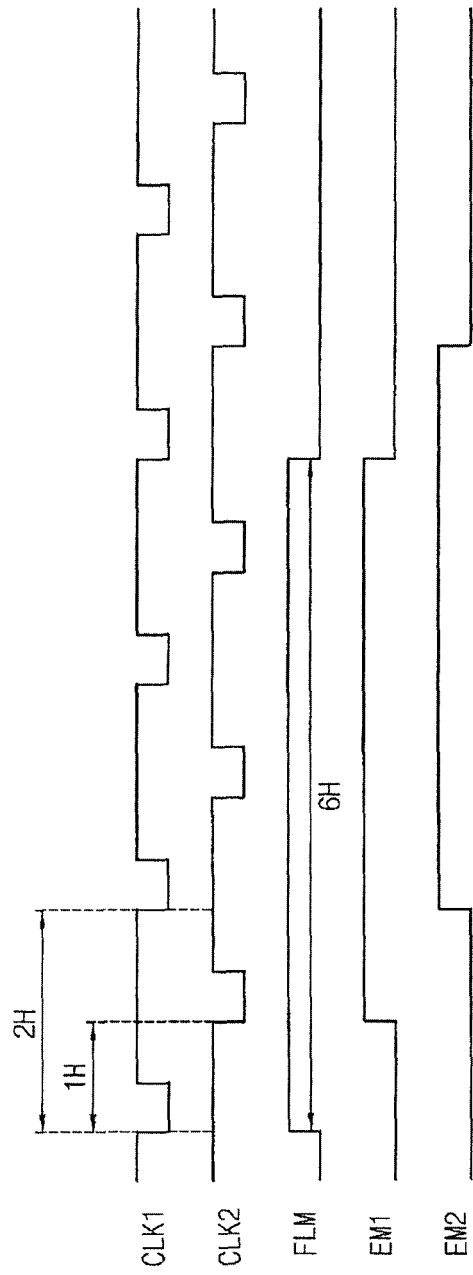

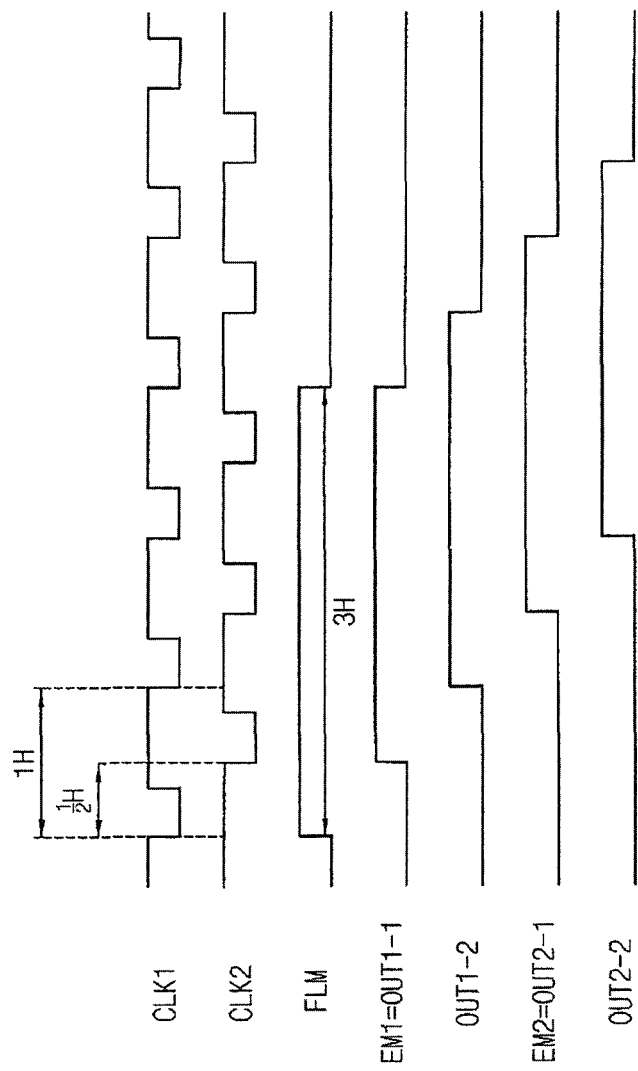

EMISSION DRIVER AND ORGANIC LIGHT EMITTING DISPLAY DEVICE HAVING THE SAME

CROSS REFERENCE TO RELATED APPLICATION

This application claims priority to, and the benefit of, Korean patent Application No. 10-2015-0091837 filed on Jun. 29, 2015, the disclosure of which is hereby incorporated by reference herein in its entirety.

BACKGROUND

1. Field

Example embodiments of the inventive concept relate to display devices. More particularly, example embodiments of the inventive concept relate to an emission driver, and to an organic light emitting display device having the emission driver.

2. Description of the Related Art

An organic light emitting display device is configured to display an image using organic light emitting diodes (OLEDs). Each of the organic light emitting diodes includes an organic layer between two electrodes, namely, between an anode and a cathode. The holes from the anode may be combined with the electrons from the cathode in the organic layer between the anode and the cathode to emit light.

The display device includes a display panel and a panel driver. The display panel includes a plurality of pixels. The panel driver includes a scan driver for providing a scan signal to the pixels, a data driver for providing a data signal to the pixels, and an emission driver for providing an emission signal to the pixel.

The organic light emitting display device is configured to adjust a length of an on-period of the emission signal to thereby adjust an emission time length of an OLED in one frame period (i.e., to control a dimming level). However, the length of the on-period of the emission signal can be adjusted depending on a period of an emission clock signal, because the emission signal is synchronized with the emission clock signal applied to the emission driver.

SUMMARY

Example embodiments provide an organic light emitting display device capable of minutely/finely adjusting a dimming level.

Example embodiments provide an emission driver for driving the organic light emitting display device.

According to some example embodiments, an organic light emitting display device may include a display panel including a plurality of scan lines, a plurality of data lines, a plurality of emission lines, and a plurality of pixels, a scan driver configured to provide a scan signal to the pixels via the scan lines, a data driver configured to provide a data signal to the pixels via the data lines, an emission driver including a plurality of emission stages for providing an emission signal to the pixels via the emission lines, and a controller configured to control the scan driver, the data driver, and the emission driver, wherein each of the emission stages includes a plurality of sub-stages dependently connected to each other, and wherein one of the sub-stages is configured to output the emission signal to one of the emission lines.

The controller may be configured to provide a plurality of scan clock signals for controlling the scan driver to the scan driver, and to provide a plurality of emission clock signals for controlling the emission driver to the emission driver, and a period of the scan clock signals may be longer than a period of the emission clock signals.

The sub-stages may include first and second sub-stages each configured to provide an output signal, which is generated by shifting a corresponding input signal to be synchronized with a first emission clock signal or a second emission clock signal, to a next sub-stage, and one of the first and second sub-stages may be configured to output the output signal as the emission signal to one of the emission lines.

The second emission clock signal may be substantially the same as the first emission clock signal shifted by a half period of the first emission clock signal.

Each of the emission stages may further include an output signal selector configured to select one of the output signal of the first sub-stage and the output signal of the second sub-stage as the emission signal.

The first sub-stage may be located opposite to the second sub-stage with respect to an emission clock line via which the emission clock signal is configured to be provided.

The sub-stages may include first to fourth sub-stages configured to provide an output signal, which is generated by shifting an input signal to be synchronized with a first emission clock signal or a second emission clock signal, to a corresponding next sub-stage, and one of the first to fourth sub-stages may be configured to output the output signal as the emission signal to one of the emission lines.

A period of the emission clock signal may be determined by dividing a period of the scan clock signals by a number of the sub-stages in one of the emission stages.

The controller may be configured to provide an emission start signal for driving the emission driver to the emission driver.

The controller may be configured to control a length of an on-period of the emission start signal based on a dimming control value for controlling a dimming level.

The length of the on-period of the emission start signal may be a multiple of a period of an emission clock signal for controlling the emission driver.

A length of the on-period of the emission start signal may correspond to a product of a length of one horizontal period and a number of the scan lines.

The dimming control value may be configured to be changed based on an external light intensity.

The controller may be configured to provide a hybrid dimming signal to the data driver based on the dimming control value, and the data driver may be configured to select one among a plurality of gamma reference voltage sets based on the hybrid dimming signal to convert image data into the data signal.

The emission signal may include at least one of an on-period and an off-period during one frame period.

According to some example embodiments, an emission driver includes a plurality of emission stages configured to output an emission signal to a plurality of emission lines, wherein each of the emission stages includes a plurality of sub-stages dependently connected to each other, and wherein one of the sub-stages is configured to output the emission signal to a corresponding one of the emission lines.

Each of the sub-stages may be configured to provide an output signal, which is generated by shifting an input signal to be synchronized with a first emission clock signal or a second emission clock signal, to a next sub-stage, and wherein one of the sub-stages is configured to output the output signal as the emission signal to one of the emission lines.

The input signal may be an emission start signal or an output signal of a previous sub-stage, and a length of an on-period of the emission start signal may be configured to be adjusted based on a dimming control value for controlling a dimming level.

The length of the on-period of the emission start signal may be a multiple of a period of the first emission clock signal.

A length of a period of the first emission clock signal and a length of a period of the second emission clock signal may be substantially the same as a length of one horizontal period.

Therefore, an emission driver according to example embodiments includes a plurality of emission stages respectively corresponding to pixel rows. Each of the emission stages includes a plurality of sub-stages, and a frequency of an emission clock signal is greater than a frequency of a gate clock signal, thereby enabling minute adjusting/fine tuning of a length of an on-period of an emission signal (i.e., a dimming level).

In addition, an organic light emitting display device according to example embodiments can increase the number of dimming steps/levels, and can improve a discontinuous dimming level by including the emission driver.

BRIEF DESCRIPTION OF THE DRAWINGS

Exemplary embodiments will be described more fully hereinafter with reference to the accompanying drawings, in which various embodiments are shown.

FIGS. 7A, 7B, 8A, and 8B are waveforms for describing increased dimming steps in the organic light emitting display device of FIG. 1.

DETAILED DESCRIPTION

Figure 1:
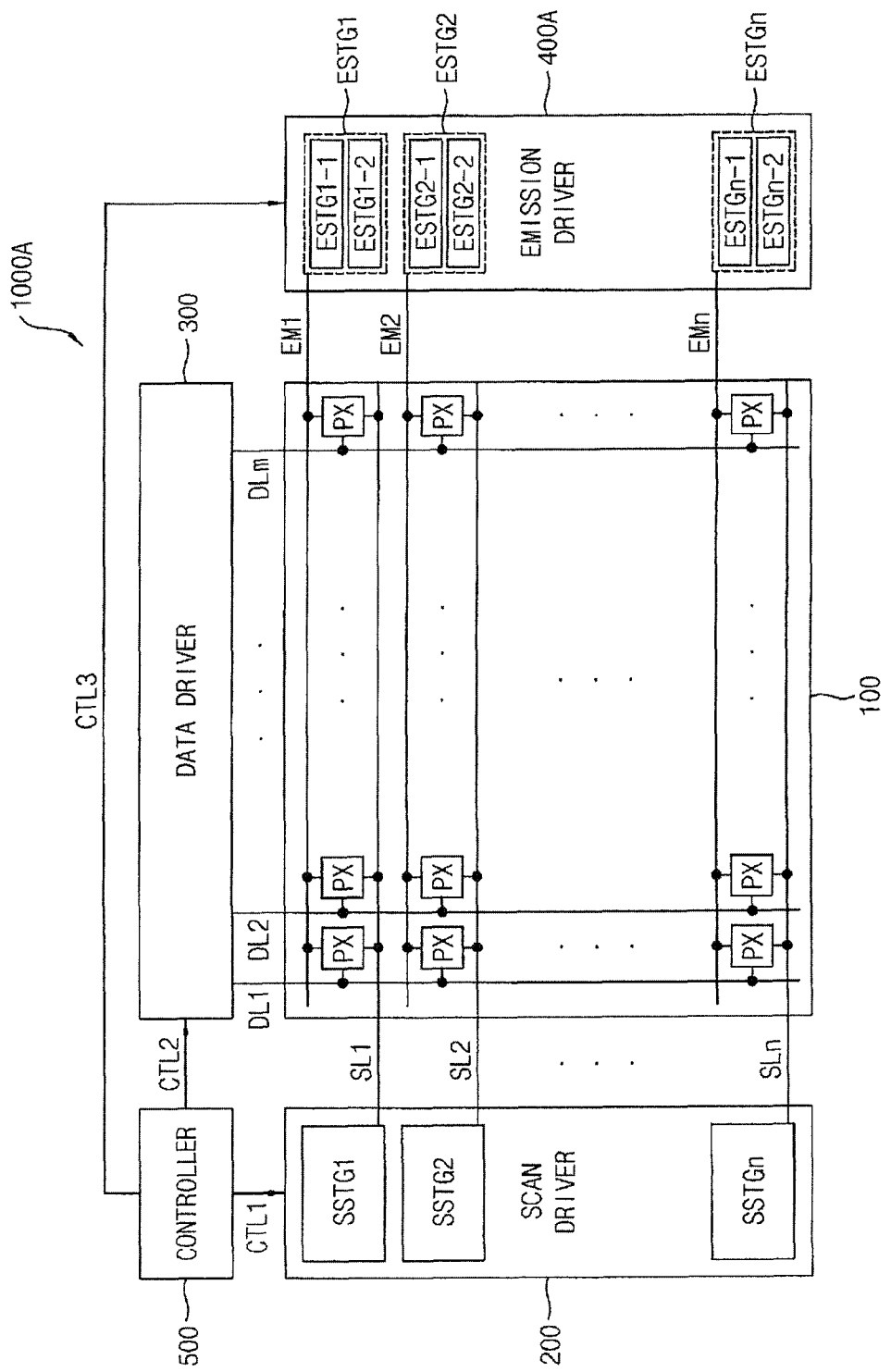
FIG. 1 is a block diagram illustrating an organic light emitting display device according to one example embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Exemplary embodiments will be described more fully hereinafter with reference to the accompanying drawings, in which various embodiments are shown.

FIG. 1 is a block diagram illustrating an organic light emitting display device according to one example embodiment.

Referring to FIG. 1, the organic light emitting display device 1000A may include a display panel 100, a scan driver 200, a data driver 300, an emission driver 400A, and a controller 500.

The display panel 100 may display an image. The display panel 100 may include a plurality of scan lines SL1 through SLn, a plurality of data lines DL1 through DLm, a plurality of emission lines EM1 through EMn, and a plurality of pixels PX. For example, the display panel 100 may include n*m pixels PX, because the pixels PX are arranged at locations corresponding to crossing points of respective ones of the scan lines SL1 through SLn and the data lines DL1 through DLm.

The scan driver 200 may provide a respective scan signal to the plurality of pixels PX via the scan lines SL1 through SLn. In one example embodiment, the scan driver 200 may include a plurality of scan stages for respectively outputting the scan signal to the scan lines SL1 through SLn based on a first control signal CTL1.

The data driver 300 may provide a respective data signal to the plurality of pixels PX via the data lines DL1 through DLm based on a second control signal CTL2. In one example embodiment, the data driver 300 may select one among a plurality of gamma reference voltage sets based on a hybrid dimming signal to thereby convert image data into the data signal. Hereinafter, the data driver 300 will be described in more detail with reference to FIG. 10.

The emission driver 400A may include a plurality of emission stages ESTG1 through ESTGn for respectively providing the emission signal to the pixels PX via the emission lines EM1 through EMn. Each of the emission stages ESTG1 through ESTGn may include a plurality of sub-stages dependently connected to each other. For example, the first emission stage ESTG1 may include the (1-1)st sub-stage ESTG1-1 and the (1-2)nd sub-stage ESTG1-2. The second emission stage ESTG2 may include the (2-1)st sub-stage ESTG2-1 and the (2-2)nd sub-stage ESTG2-2. Each of the emission stages ESTG1 through ESTGn may output the emission signal generated by a respective one of the sub-stages to one of the emission lines. For example, odd number sub-stages, such as the (1-1)st sub-stage ESTG1-1 and the (2-1)st sub-stage ESTG2-1, may respectively output the emission signal to the first emission line EM1 and the second emission line EM2. Thus, the emission stages ESTG1 through ESTGn respectively correspond to pixel rows. Each of the emission stages ESTG1 through ESTGn may include the sub-stages dependently connected to each other, and one of the sub-stages may output the emission signal. Therefore, the emission driver 400A may include the plurality of sub-stages, which respectively correspond to pixel rows, and may increase a resolution of the emission signal by increasing a frequency of an emission clock signal. Accordingly, the emission driver 400A can finely adjust a dimming level.

The controller 500 may control the scan driver 200, the data driver 300, and the emission driver 400A. The controller 500 may generate control signals CTL1, CTL2, and CTL3 to respectively control the scan driver 200, the data driver 300, and the emission driver 400A. The first control signal CTL1 for controlling the scan driver 200 may include a scan start signal, a first scan clock signal, and/or a second scan clock signal, etc. The second control signal CTL2 for controlling the data driver 300 may include image data, a horizontal start signal, and/or a hybrid dimming signal, etc. The third control signal CTL3 for controlling the emission driver 400A may include an emission start signal, a first emission clock signal, and/or a second emission clock signal, etc. In one example embodiment, the second emission clock signal may be substantially the same as the first emission clock signal shifted by a half period.

The controller 500 may set a period of the emission clock signals to be shorter than a period of the scan clock signals, based on the number of sub-stages included in one emission stage, to thereby minutely adjust the dimming level. In one example embodiment, the period of the emission clock signal may be determined by dividing the period of the scan clock signals by the number of the sub-stages included in one emission stage. For example, each emission stage may include two sub-stages, and a period of the first scan clock signal may be longer than (e.g., twice as long as) a period of the first emission clock signal.

The controller 500 may control a length of an on-period of the emission start signal based on a dimming control value. Here, the dimming control value indicates a value for controlling a dimming level. In one example embodiment, the dimming control value may be changed based on an external light intensity (i.e., light intensity outside of the display device). For example, in the dark (i.e., low external light intensity), the dimming control value may be set to a relatively low dimming level to protect/comfort the eyes or to prevent glare. On the other hand, in daylight (i.e., high external light intensity), the dimming control value may be set to relatively high dimming level to improve visibility. In another example embodiment, the dimming control value may be changed based on externally provided signals to the display device, such as signals corresponding to a user input.

In one example embodiment, the controller 500 may provide the hybrid dimming signal to the data driver 300 to more finely adjust the dimming level. For example, when the dimming level corresponding to the dimming control value cannot be set by adjusting the length of the on-period of the emission start signal, the controller 500 may provide the hybrid dimming signal to the data driver 300 to perform a hybrid dimming operation. Here, the hybrid dimming operation indicates an operation for concurrently performing the impulse dimming operation for adjusting the length of the on-period of the emission signal, and the gamma dimming operation for adjusting the gamma reference voltage.

In addition, the organic light emitting display device 1000A may further include a power supply providing a high power voltage and a low power voltage to the display panel 100.

Therefore, the organic light emitting display device 1000A can increase the number of dimming steps, and can improve the discontinuous dimming level by arranging a plurality of sub-stages in each emission stage that corresponds to a respective pixel row.

Figure 2:
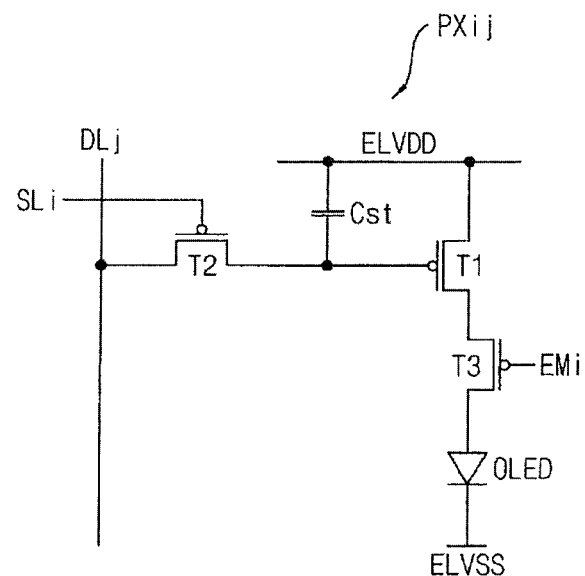
FIG. 2 is a circuit diagram illustrating an example of a pixel included in the organic light emitting display device of FIG. 1.

FIG. 2 is a circuit diagram illustrating an example of a pixel included in the organic light emitting display device of FIG. 1.

Referring to FIG. 2, the pixel PXij may include an organic light emitting diode OLED, a driving transistor T1, a capacitor Cst, a switching transistor T2, and an emission transistor T3.

The driving transistor T1 may include a gate electrode connected to a second electrode of the switching transistor T2, a first electrode for receiving a high power voltage ELVDD, and a second electrode connected to a first electrode of the emission transistor T3.

The switch transistor T2 may include a gate electrode connected to a scan line SLi, a first electrode connected to a data line DLj, and the second electrode connected to the gate electrode of the driving transistor T1. The switching transistor T2 may be configured to be turned on in response to a scan signal received from the scan line SLi. The switching transistor T2 may provide a data signal received from the data line DLj to the gate electrode of the driving transistor T1.

The capacitor Cst may include a first electrode connected to the first electrode of the driving transistor T1, and a second electrode connected to the gate electrode of the driving transistor T1. The capacitor Cst may charge the data signal applied to the gate electrode of the driving transistor T1, and may maintain the charged signal.

The emission transistor T3 may include a gate electrode connected to an emission line EMi, the first electrode connected to the second electrode of the driving transistor T1, and a second electrode connected to an anode electrode of the OLED. The emission transistor T3 may be turned on in response to an emission signal received from the emission line EMi. The emission transistor T3 may provide a driving current flowing through the driving transistor T1 to the OLED.

The OLED may include the anode electrode connected to the second electrode of the emission transistor T3, and a cathode electrode for receiving a low power voltage ELVSS. The OLED may emit the light based on the driving current provided from the driving transistor T1 through the emission transistor T3.

Figure 3:
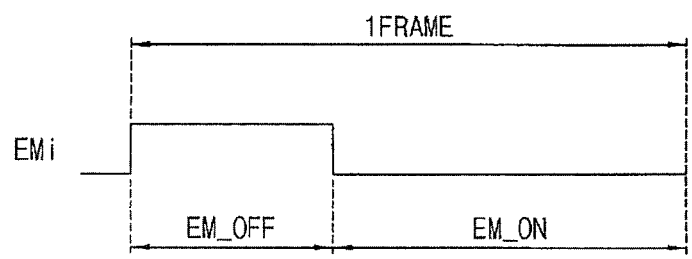
FIG. 3 is a waveform illustrating an example that an emission driver included in the organic light emitting display device of FIG. 1 controls an emission time of a pixel.

FIG. 3 is a waveform illustrating an example that an emission driver included in the organic light emitting display device of FIG. 1 controls an emission time of a pixel.

Referring to FIG. 3, the emission signal may include at least one of an on-period EM_ON and an off-period EM_OFF during one frame period. The emission driver may adjust emission time length of the pixel in one frame period by controlling a length of the on-period EM_ON of the emission signal.

Because luminance of the pixel is proportional to the emission time length, the emission driver can control the dimming level by adjusting a ratio of the on-period EM_ON of the emission signal to the off-period EM_OFF of the emission signal. Here, a dimmed luminance value may be calculated according to Equation 1 below:

$$\text{LUM\_DIM} = \text{LUM\_MAX} * \text{LEN\_EMON} / \text{LEN\_FRAME}, \qquad \text{Equation 1}$$

where, LUM_DIM is the dimmed luminance value, LUM_MAX is a maximum luminance value, LEN_EMON is a time length of the on-period (e.g., EM_ON) of the emission signal, and LEN_FRAME is a time length of one frame period.

Although, the example embodiment of FIG. 3 describes that the emission signal includes one on-period and one off-period during one frame period, the emission signal may include a plurality of on-periods and a plurality of off-periods to prevent flicker and/or the occurrence of a stripe pattern.

Figure 4:
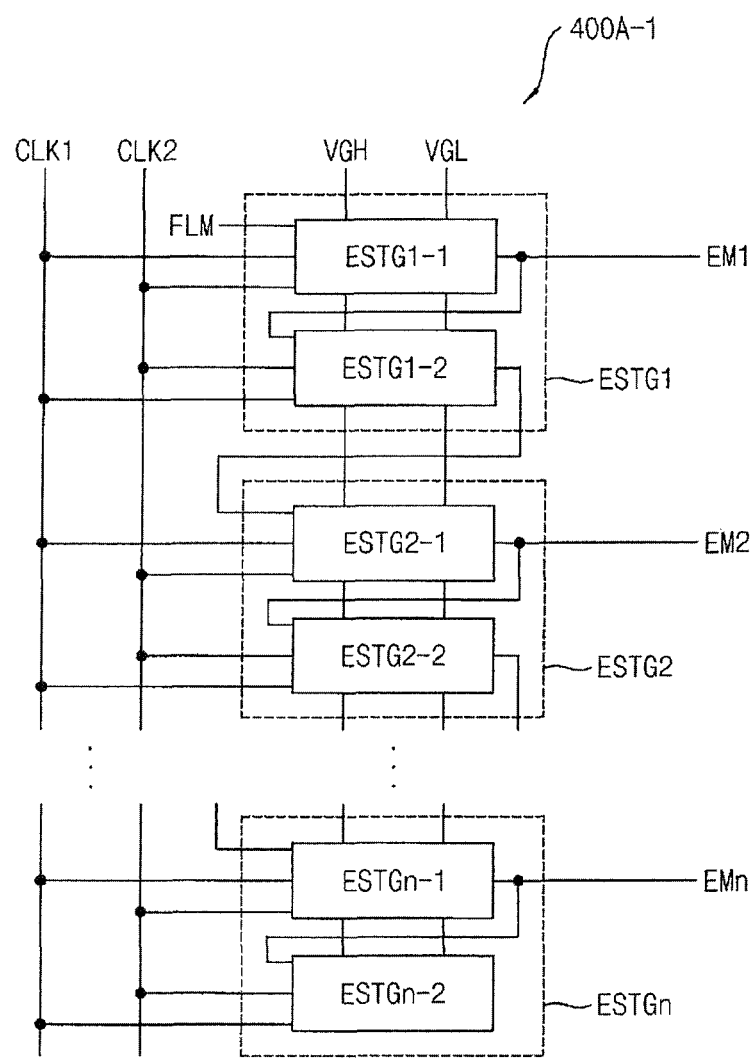
FIG. 4 is a block diagram illustrating an example of an emission driver included in the organic light emitting display device of FIG. 1.

FIG. 4 is a block diagram illustrating an example of an emission driver included in the organic light emitting display device of FIG. 1.

Referring to FIG. 4, each of the emission stages ESTG1 through ESTGn included in the emission driver 400A-1 may include two sub-stages. Each of the sub-stages may receive either an emission start signal FLM or an output signal of a previous sub-stage as an input signal, and may also receive a first voltage VGL, a second voltage VGH that is higher than the first voltage VGL, a first emission clock signal CLK1, and a second emission clock signal CLK2. For example, the (1-1)st sub-stage ESTG1-1 of the emission stage ESTG1 may receive the emission start signal FLM as the input signal, and other sub-stages of the emission stages ESTG1 through ESTGn may receive the output signal of the respective previous sub-stage as the input signal.

All sub-stages may be dependently connected to each other, and may be driven sequentially. For example, an output signal of the (1-1)st sub-stage ESTG1-1 may be provided to the (1-2)nd sub-stage ESTG1-2, and an output signal of the (1-2)nd sub-stage ESTG1-2 of the emission stage ESTG1 may be provided to the (2-1)st sub-stage ESTG2-1 of the emission stage ESTG2.

One of the sub-stages included in one emission stage (e.g., emission stage ESTGk) may output the emission signal to a corresponding emission line (e.g., emission line EMk). For example, the (1-1)st sub-stage ESTG1-1 and the (2-1)st sub-stage ESTG2-1 (i.e., odd number sub-stages) may output the emission signal to the first emission line EM1 and the second emission line EM2, respectively.

Figure 5:
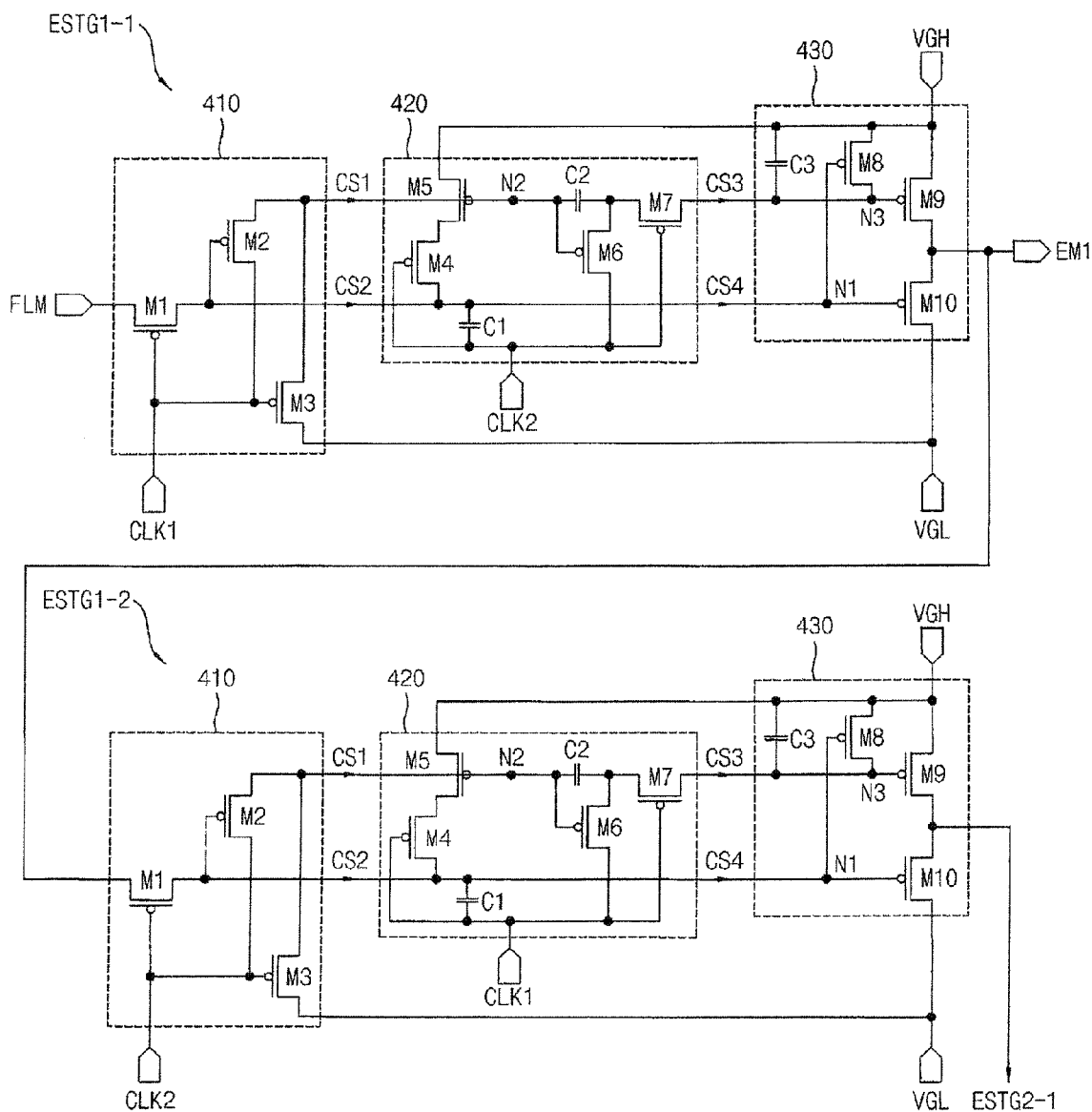
FIG. 5 is a circuit diagram illustrating an example of an emission stage included in the emission driver of FIG. 4.

FIG. 5 is a circuit diagram illustrating an example of an emission stage included in the emission driver of FIG. 4.

Referring to FIG. 5, a first emission stage may include a (1-1)st sub-stage ESTG1-1 and a (1-2)nd sub-stage ESTG1-2. Each of the (1-1)st sub-stage ESTG1-1 and the (1-2)nd sub-stage ESTG1-2 may respectively include a first signal processor 410, a second signal processor 420, and a third signal processor 430.

The first signal processor 410 may receive a first sub-control signal and a second sub-control signal. In detail, the first signal processor 410 may receive either the emission start signal FLM or the output signal of the previous sub-stage as the first sub-control signal. The first signal processor 410 of each of odd numbered sub-stages ESTG1-1, ESTG2-1, . . . , ESTGn-1 may receive the first emission clock signal CLK1 as the second sub-control signal. On the other hand, the first signal processor 410 of each of even numbered sub-stages ESTG1-2, ESTG2-2, . . . , ESTGn-2 may receive the second emission clock signal CLK2 as the second sub-control signal. Accordingly, the first signal processor 410 may receive the first voltage VGL, and may generate a first signal CS1 and a second signal CS2 in response to the first and second sub-control signals. The first signal CS1 and the second signal CS2 may be applied to the second signal processor 420. For example, the first signal processor 410 of the (1-1)st sub-stage ESTG1-1 may receive the first voltage VGL, and may generate the first signal CS1 and the second signal CS2 in response to the emission start signal FLM and the first emission clock signal CLK1. The first signal processor 410 may provide the first signal CS1 and the second signal CS2 to the second signal processor 420.

The first signal processor 410 may include first, second, and third transistors M1, M2, and M3. The first through third transistors M1 through M3 may be PMOS transistors. The first transistor M1 may include a gate electrode for receiving the first emission clock signal CLK1, a first electrode for receiving the emission start signal FLM, and a second electrode connected to a gate electrode of the second transistor M2. The second transistor M2 may include the gate electrode connected to the second electrode of the first transistor M1, a first electrode connected to a first electrode of the third transistor M3, and a second electrode for receiving the first emission clock signal CLK1. The third transistor M3 has a gate electrode for receiving the first emission clock signal CLK1 that is also connected to the second electrode of the second transistor M2, the first electrode connected to the first electrode of the second transistor M2, and a second electrode for receiving the first voltage VGL.

The first signal CS1 may be outputted from the first electrodes of the second and third transistors M2 and M3, which are connected to each other. The second signal CS2 may be outputted from the second electrode of the first transistor M1.

The second signal processor 420 may receive a third sub-control signal. In detail, the second signal processor 420 of each of the odd numbered sub-stages ESTG1-1, ESTG2-1, . . . , ESTGn-1 may receive the second emission clock signal CLK2 as the third sub-control signal. The second signal processor 420 of each of the even numbered sub-stages ESTG1-2, ESTG2-2, . . . , ESTGn-2 may receive the first emission clock signal CLK1 as the third sub-control signal.

The second signal processor 420 may receive the second voltage VGH, and may generate a third signal CS3 and a fourth signal CS4 in response to the third sub-control signal, the first signal CS1, and the second signal CS2. The third signal CS3 and the fourth signal CS4 may be provided to the third signal processor 430. For example, the second signal processor 420 of the (1-1)st sub-stage ESTG1-1 may receive the second voltage VGH, and may generate the third signal CS3 and the fourth signal CS4 in response to the first and second signals CS1 and CS2 received from the first signal processor 410, and in response to the second emission clock signal CLK2. The second signal processor 420 may provide the third signal CS3 and the fourth signal CS4 to the third signal processor 430.

The second signal processor 420 may include fourth through seventh transistors M4 through M7, and first and second capacitors C1 and C2. The fourth to seventh transistors M4 through M7 may be PMOS transistors. The fourth transistor M4 may include a gate electrode for receiving the second emission clock signal CLK2, a first electrode connected to a first node N1 and connected to the gate electrode of the second transistor M2 of the corresponding first signal processor 410, and a second electrode connected to a second electrode of the fifth transistor M5. The first capacitor C1 may include a first electrode for receiving the second emission clock signal CLK2, and a second electrode connected to the first electrode of the fourth transistor M4 and the first node N1. The fifth transistor M5 may include a gate electrode connected to the first electrode of the third transistor M3 at a second node N2, a first electrode for receiving the second voltage VGH, and the second electrode connected to the second electrode of the fourth transistor M4. The sixth transistor M6 may include a gate electrode connected to the second node N2, a first electrode connected to a second electrode of the seventh transistor M7, and a second electrode for receiving the second emission clock signal CLK2. The second capacitor C2 may include a first electrode connected to the gate electrode of the sixth transistor M6, and a second electrode connected to the first electrode of the sixth transistor M6. The seventh transistor M7 may include a gate electrode for receiving the second clock signal CLK2, a first electrode connected to a third node N3, and the second electrode connected to the first electrode of the sixth transistor M6.

The third signal CS3 may be provided to the third node N3, and the fourth signal CS4 may be provided to the first node N1. The third signal processor 430 of the (1-1)st sub-stage ESTG1-1 may receive the first voltage VGL and the second voltage VGH, and may generate the output signal in response to the third signal CS3 and the fourth signal CS4 provided from the second signal processor 420. The output signal of the (1-1)st sub-stage ESTG1-1 may be provided to the first signal processor 410 of the (1-2)nd sub-stage ESTG1-2. Also, the output signal of the (1-1)st sub-stage ESTG1-1 may be provided to the pixels connected to the first emission line EM1 corresponding the first pixel row.

The third signal processor 430 may include eighth through tenth transistors M8 through M10 and a third capacitor C3. The eight through tenth transistors M8 through M10 may be PMOS transistors.

The eighth transistor M8 may include a gate electrode connected to the first node N1, a first electrode receiving the second voltage VGH, and a second electrode connected to the third node N3. The third capacitor C3 may include a first electrode for receiving the second voltage VGH, and a second electrode connected to the third node N3. The ninth transistor M9 may include a gate electrode connected to the third node N3, a first electrode for receiving the second voltage VGH, and a second electrode connected to a first signal processor 410 of a next sub-stage. The tenth transistor M10 may include a gate electrode connected to the first node N1, a first electrode connected to the first signal processor 410 of the next sub-stage, and a second electrode for receiving the first voltage VGL.

Figure 6:
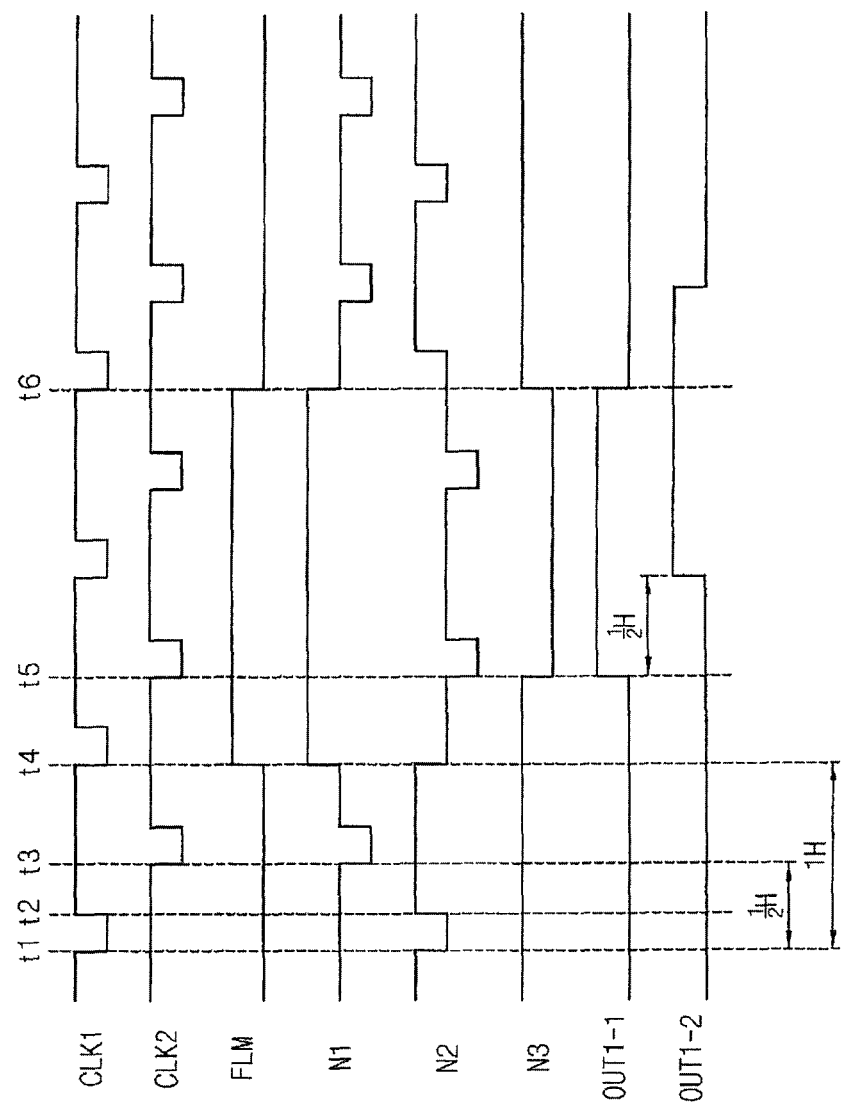
FIG. 6 is a waveform for describing an operation of the emission stage of FIG. 5.

FIG. 6 is a waveform for describing an operation of an emission stage of FIG. 5.

Referring to FIG. 6, a first emission clock signal CLK1 and a second emission clock signal CLK2 may have substantially the same frequency. For example, the periods of the first emission clock signal CLK1 and the second emission clock signal CLK2 may be one horizontal period 1H. The second emission clock signal CLK2 may be substantially the same as a signal resulting from shifting the first emission clock signal CLK1 by a half period (i.e., ½ H) of the first emission clock signal CLK1.

An emission start signal FLM may be provided to only the (1-1)st sub-stage ESTG1-1. A length of an on-period of the emission start signal FLM (e.g., a low level period) and an off-period of the emission start signal FLM (e.g., a high level period) may be adjusted based on a dimming control value for controlling a dimming level. The emission start signal FLM may change from a low level to a high level (e.g., from the on-period to the off-period) when the first emission clock signal CLK1 changes from the high level to the low level.

The first voltage VGL may have the low level, and the second voltage VGH may have the high level.

The emission start signal FLM and the first emission clock signal CLK1 may have the low level during a first time point t1, and the second emission clock signal CLK2 may have the high level during the first time point t1. The first emission clock signal CLK1 having the low level may be applied to the gate electrode of the first transistor M1 and to the gate electrode of the third transistor M3. Accordingly, the first and third transistors M1 and M3 may be turned on.

The first emission clock signal CLK1 having the low level and the first voltage VGL may be applied to the second node N2 respectively through the turned-on second transistor M2 and the turned-on third transistor M3. Therefore, a voltage at the second node N2 may have the low level. The second emission clock signal CLK2 having the high level may be applied to the gate electrode of the fourth transistor M4 and to the gate electrode of the seventh transistor M7. Thus, the fourth and seventh transistors M4 and M7 are turned off.

Because the voltage at the first node N1 has the low level, the eighth transistor M8 may be turned on. The second voltage VGH may be applied to the third node N3 through the turned-on eighth transistor M8. Accordingly, a voltage at the third node N3 may have the high level corresponding to the second voltage VGH. The third capacitor C3 may be charged with the second voltage VGH. Thus, the third capacitor C3 may be charged with the voltage having the high level. Since the voltage of the third node N3 has the high level, the ninth transistor M9 may be turned off.

Because the voltage at the first node N1 has the low level, the tenth transistor M10 may be turned on. Because of the turned-on tenth transistor M10, the output signal OUT1-1 of the (1-1)st sub-stages may have the low level.

At a second time point t2, the emission start signal FLM may have the low level, and the first and second emission clock signals CLK1 and CLK2 may have the high level. Accordingly, the first and third transistors M1 and M3 are turned off by the first clock signal CLK1 having the high level.

Because the voltage at the first node N1 is maintained at the low level, the second transistor M2 may be turned on. The first emission clock signal CLK1 having the high level may be applied to the second node N2 through the turned-on second transistor M2. Accordingly, the voltage of the second node N2 may have the high level.

Because the voltage of the first node N1 has the low level, the eighth and tenth transistors M8 and M10 may be turned on. The second voltage VGH may be applied to the third node N3 through the turned-on eighth transistor M8, so that the voltage of the third node N3 may be maintained at the high level.

Because the voltage of the third node N3 has the high level, and because the voltage of the first node N1 has the low level, the ninth transistor M9 may be turned off, and the tenth transistor M10 may be turned on. Accordingly, the output signal OUT1-1 of the (1-1)st sub-stage may remain at the low level.

At a third time point t3, the second emission clock signal CLK2 may change from the high level to the low level, and thereafter change from the low level back to the high level again. Thus, an electric potential at the first node N1 may be boot-strapped by a variation of electric potential of the second emission clock signal CLK2 due to the coupling of the first capacitor C1. That is, at the second time point t2, a voltage of the first node N1 is the low level, and may be a voltage level lower than the second level in the low level period of the second emission clock signal CLK2 due to the coupling of the first capacitor C1. Generally, the PMOS transistor has good driving characteristics as the voltage having the low level is applied to the PMOS transistor. Because the voltage of the first node N1 has the voltage level that is lower than the second level during the low level period of the second emission clock signal CLK2, the driving characteristics of the eighth and tenth transistors M8 and M10 may be improved. The output signal OUT1-1 of the (1-1)st sub-stage may be maintained at the low level.

At a fourth time point t4, the emission start signal FLM and the second emission clock signal CLK2 may have the high level, and the first emission clock signal CLK1 may initially have the low level. The first transistor M1 may be turned on by the first clock signal CLK1 having the low level, and the emission start signal FLM having the high level may be applied to the first node N1. Because the voltage of the first node N1 has the high level, the second and the tenth transistors M2 and M10 may be turned off.

The third transistor M3 may be turned on in response to the first emission clock signal CLK1 having the low level, and the first voltage VGL may be applied to the second node N2. Therefore, the voltage of the second node N2 may have the low level. The seventh transistor M7 may be turned off in response to the second emission clock signal CLK2 having the high level. Because the voltage of the first node N1 has the high level, the eighth transistor M8 may be turned off. The voltage of the third node N3 may be maintained at the high level by the third capacitor C3. Because the voltage of the third node N3 is maintained at the high level, the ninth transistor M9 may be turned off. Therefore, the output signal OUT1-1 of the (1-1)st sub-stage may continue to be maintained at the low level.

At a fifth time point t5, the emission start signal FLM and the first emission clock signal CLK1 may have the first/high level, and the second emission clock signal CLK2 may initially have the second/low level.

The first and third transistors M1 and M3 may be turned off by the first emission clock signal CLK1 having the high level. Because the voltage of the first node N1 is maintained at the high level, the second, eighth, and tenth transistors M2, M8, and M10 may be turned off.

The fourth and seventh transistors M4 and M7 may be turned on in response to the second emission clock signal CLK2 having the low level. In addition, because the voltage of the second node N2 has the low level, the fifth and sixth transistors M5 and M6 may be turned on.

As the boot-strap described above, the electric potential of the second node N2 may be boot-strapped by the variation of the electric potential of the second emission clock signal CLK2 due to the coupling of the second capacitor C2. That is, the voltage of the second node N2 may have the level that is lower than the second level during the low level period of the second emission clock signal CLK2.

The second emission clock signal CLK2 having the low level may be applied to the third node N3 through the turned-on sixth and seventh transistors M6 and M7. Accordingly, the voltage of the third node N3 may have the low level at the fifth time point t5. Because the voltage of the third node N3 has the low level, the ninth transistor M9 may be turned on.

The output signal OUT1-1 of the (1-1)st sub-stage may have the high level because the ninth transistor M9 is turned on and the tenth transistor M10 is turned off.

At a sixth time point t6, the emission start signal FLM and the first emission clock signal CLK1 may have the low level, and the second emission clock signal CLK2 may initially have the high level. The output signal OUT1-1 of the (1-1)st sub-stage may have the low level at the sixth time point t6.

The output signal OUT1-1 of the (1-1)st sub-stage may be provided to the (1-2)nd sub-stage. Also, the output signal OUT1-1 of the (1-1)st sub-stage may be provided to the pixels corresponding to the first pixel row via the first emission line EM1.

The (1-2)nd sub-stage may generate an output signal OUT1-2 in response to the output signal OUT1-1 of the (1-1)st sub-stage, the first emission clock signal CLK1, and the second emission clock signal CLK2.

The output signal OUT1-2 of the (1-2)nd sub-stage may be determined by shifting the output signal OUT1-1 of the (1-1)st sub-stage by a half of horizontal period. Thus, output signals of sub-stages may be progressively outputted according to a shifting of the previous output signal by a half of horizontal period.

FIGS. 7A, 7B, 8A, and 8B are waveforms for describing increased dimming steps in the organic light emitting display device of FIG. 1. FIG. 9 is a graph for describing an effect of the organic light emitting display device of FIG. 1.

Referring to FIGS. 7A through 9, the organic light emitting display device may arrange a plurality of sub-stages in one pixel row, and may increase a frequency of the emission clock signal. Accordingly, the organic light emitting display device can minutely/finely adjust a length (i.e., a dimming level) of an on-period of the emission signal.

Figure 7A:
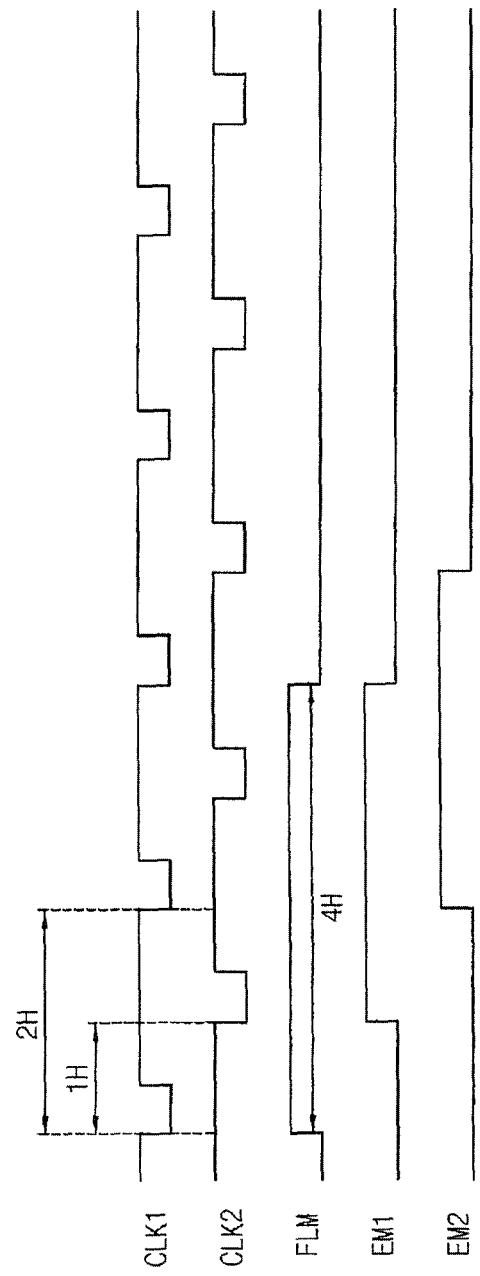

As shown in FIGS. 7A and 7B, when one sub-stage corresponds to one pixel row, a period of the first and second emission clock signals CLK1, CLK2 may be two horizontal periods 2H. Because the emission start signal FLM and the output signals (i.e., emission signals EM1, EM2) of the sub-stages may be synchronized with the first and second emission clock signals CLK1, CLK2, lengths of on-periods and off-periods of the emission start signal FLM and of the emission signals EM1, EM2 may be adjusted in units of two horizontal periods 2H.

In this case, the number of dimming steps can be determined by a resolution of the display device. For example, in the display device supporting Full HD (high definition, 1920*1080) resolution, when one sub-stage corresponds to one pixel row, the number of dimming steps may be 960 (i.e., 1920/2=960). In the display device supporting a relatively low resolution (e.g., 320*340) such as a display device for a smart watch, when one sub-stage corresponds to one pixel row, the number of dimming steps may be 160 (i.e., 320/2=160). Therefore, the display device supporting the relatively low resolution, such as the smart watch, may have the more limited number of dimming steps.

Figure 8A:
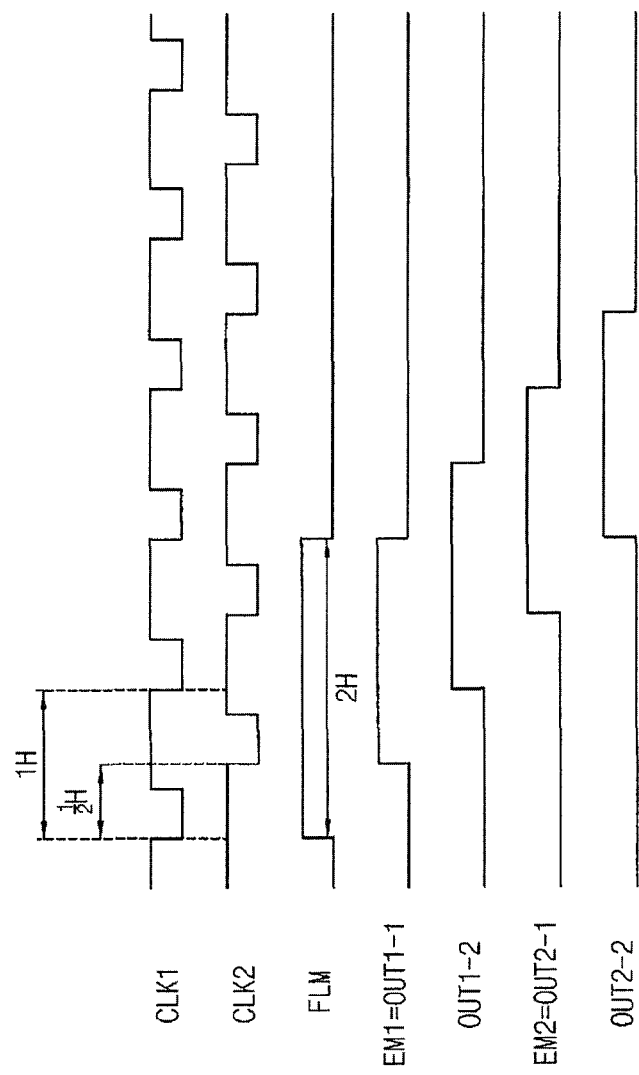
Figure 9:
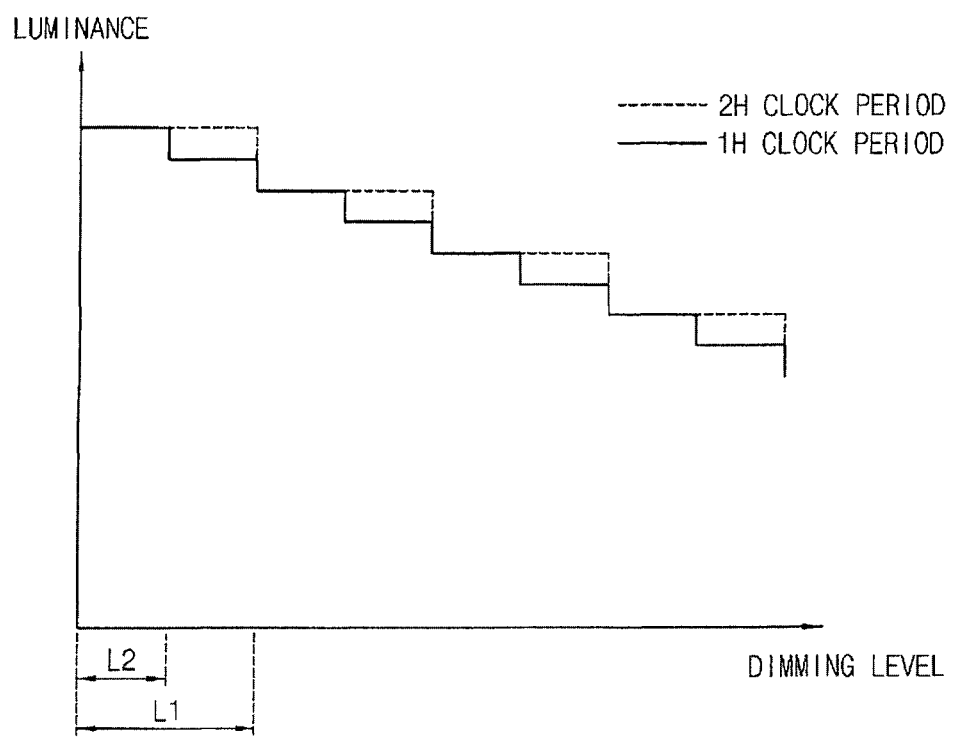
FIG. 9 is a graph for describing an effect of the organic light emitting display device of FIG. 1.

As shown in FIGS. 8A and 8B, when two sub-stages corresponds to one pixel row, a period of the first and second emission clock signals CLK1, CLK2 may be one horizontal period 1H. Because the emission start signal FLM and the output signals OUT1-1, OUT1-2, OUT2-1, OUT2-2 of the sub-stages may be synchronized with the first and second emission clock signals CLK1, CLK2, lengths of on-periods and off-periods of the emission start signal FLM and the emission signals EM1, EM2 (e.g., output signals of the (1-1)st and (2-1)st sub-stages) may be adjusted in units of one horizontal period 1H. In addition, the length of the on-period of the emission start signal FLM may be adjusted in range of a product of a length of one horizontal period and a number of the scan lines.

In this case, the number of dimming steps can increase. For example, in the display device supporting a relatively low resolution (e.g., 320*340) such as a display device for a smart watch, when two sub-stages corresponds to one pixel row, the number of dimming steps may be 320 (i.e., 320/2*2=320). Therefore, the dimming level of the display device can be more minutely adjusted.

Although the example embodiments of FIGS. 8A and 8B describe that two sub-stages corresponds to one pixel row, a greater plurality of sub-stages may correspond to one pixel row. In this case, a period of the emission clock signal may be inversely proportional to the number of sub-stages corresponding to one pixel row, and a length of on-periods of the emission signal may be adjusted as a multiple of the period of the emission clock signal.

As shown in FIG. 9, when one sub-stage corresponds to one pixel row, the organic light emitting display device has a discontinuous dimming level because of a limitation of the number of dimming steps. For example, when one sub-stage corresponds to one pixel row, and when the period of the emission signal is two horizontal periods 2H, the dimming level may be adjusted in units of a first level L1.

On the other hand, when a plurality of sub-stages corresponds to one pixel row, the organic light emitting display device may improve the discontinuous dimming level, because the number of dimming steps increases according to the number of the sub-stages corresponding one pixel row. For example, when two sub-stages correspond to one pixel row, and when the period of the emission signal is one horizontal period 1H, the dimming level may be adjusted in units of a second level L2 having a length that is half of a length of the first level L1.

Figure 10:
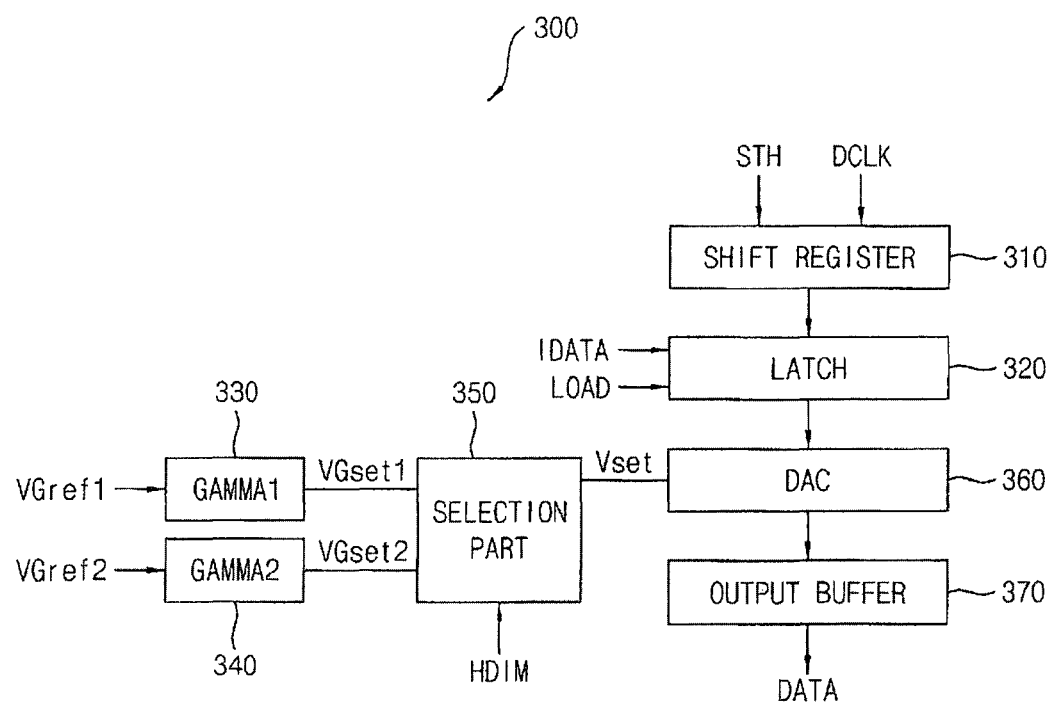
FIG. 10 is a block diagram illustrating one example of the data driver included in the organic light emitting display device of FIG. 1.

FIG. 10 is a block diagram illustrating one example of the data driver included in the organic light emitting display device of FIG. 1.

Referring to FIG. 10, the data driver 300 may select one among a plurality of gamma reference voltage sets based on the hybrid dimming signal to convert image data into the data signal. The data driver 300 may include a shift register 310, a latch circuit 320, a first gamma voltage provider 330, a second gamma voltage provider 340, a voltage set selector/selection part 350, a digital-analog converter (DAC) 360, and an output buffer 370.

The shift register 310 may receive a horizontal start signal STH and a data clock signal DCLK. The shift register 310 may shift the horizontal start signal STH for synchronizing the data clock signal DCLK to generate a sampling signal.

The latch circuit 320 may latch input data IDATA in response to the sampling signal. The latch circuit 320 may output the latched input data IDATA in response to a load signal LOAD.

The first and second gamma voltage providers 330 and 340 may respectively generate first and second gamma reference voltage sets VGset1 and VGset2 by distributing first and second gamma reference voltages VGref1 and VGref2 by a resistance string.

The voltage set selector 350 may selectively output the first gamma reference voltage sets VGset1 or the second gamma reference voltage sets VGset2 as the voltage set Vset. For example, when a hybrid dimming signal HDIM is not set, the voltage set selector 350 may select the first gamma reference voltage sets VGset1. On the other hand, when a hybrid dimming signal HDIM is set, the voltage set selector 350 may select the second gamma reference voltage sets VGset2. The voltage set selector 350 may select one of the first and second gamma reference voltage sets VGset1 and VGset2, thereby increasing the number of dimming steps in double.

The digital-analog converter 360 may convert the latched input data IDATA into the pixel data voltage based on the first gamma reference voltage sets VGset1 or the second gamma reference voltage sets VGset2 as the voltage set Vset.

The output buffer 370 may provide the pixel data voltage as the data signal DATA to the data lines.

Figure 11:
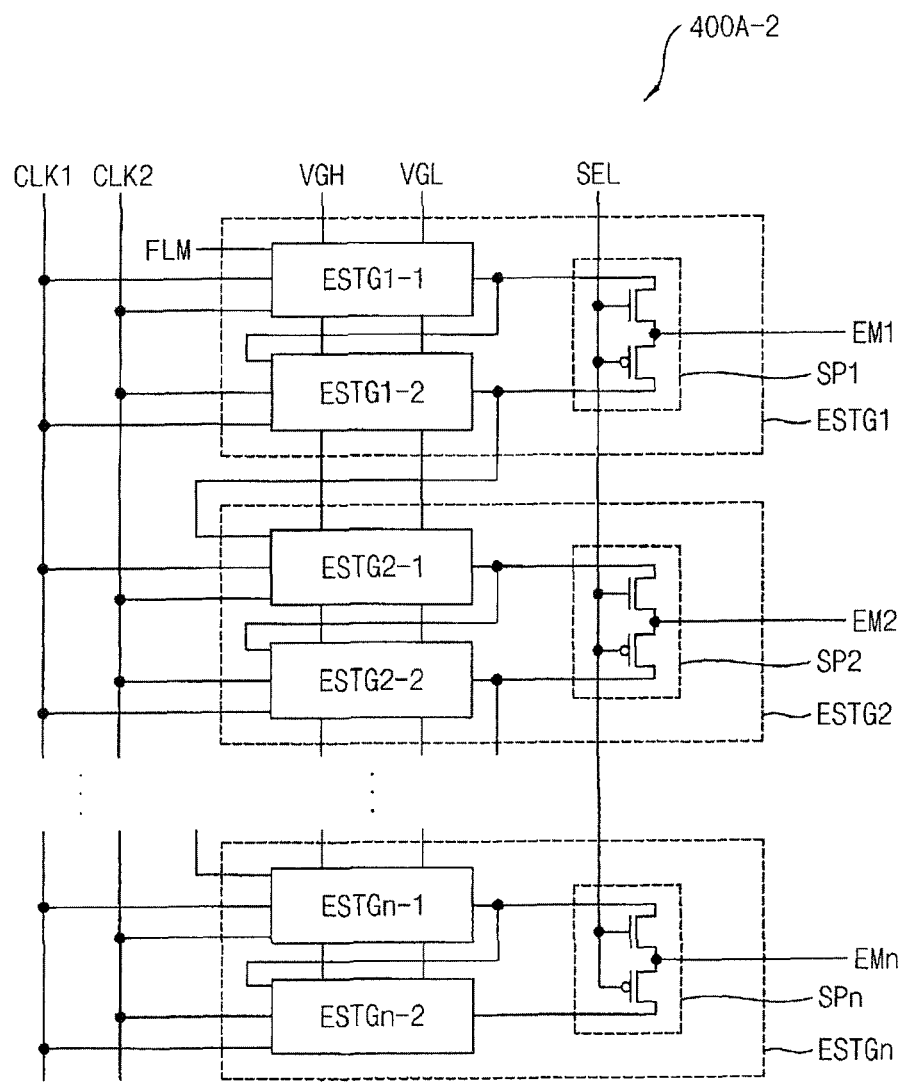
FIG. 11 is a block diagram illustrating another example of the data driver included in the organic light emitting display device of FIG. 1.

FIG. 11 is a block diagram illustrating another example of the data driver included in the organic light emitting display device of FIG. 1.

Referring to FIG. 11, each of the emission stages ESTG1 through ESTGn included in the emission driver 400A-2 (e.g., emission stage ESTGk, wherein k is an integer between 1 and n, inclusive) may include two sub-stages ESTGk-1 and ESTGk-2 and an output signal selector SPk. The emission driver 400A-2 according to the present exemplary embodiment is substantially the same as the emission driver 400A-1 of the exemplary embodiment described in FIG. 4, except that output signal selectors SP1 through SPn are respectively added in each of the emission stages ESTG1 through ESTGn. Therefore, the same reference numerals will be used to refer to the same or like parts as those described in the previous exemplary embodiment of FIG. 4, and any repetitive explanation concerning the above elements will be omitted.

The output signal selector SPk may select one of an output signal of the first sub-stage ESTGk-1 and an output signal of the second sub-stage ESTGk-2 as the emission signal to the emission line EMk. For example, the output signal selector SPk may select one of the output signals of the first and second sub-stages ESTGk-1 and ESTGk-2 based on a selection signal SEL to thereby adjust a position of on-period of the emission signal when a blank period and the on-period of the emission signal are overlapped.

Figure 12:
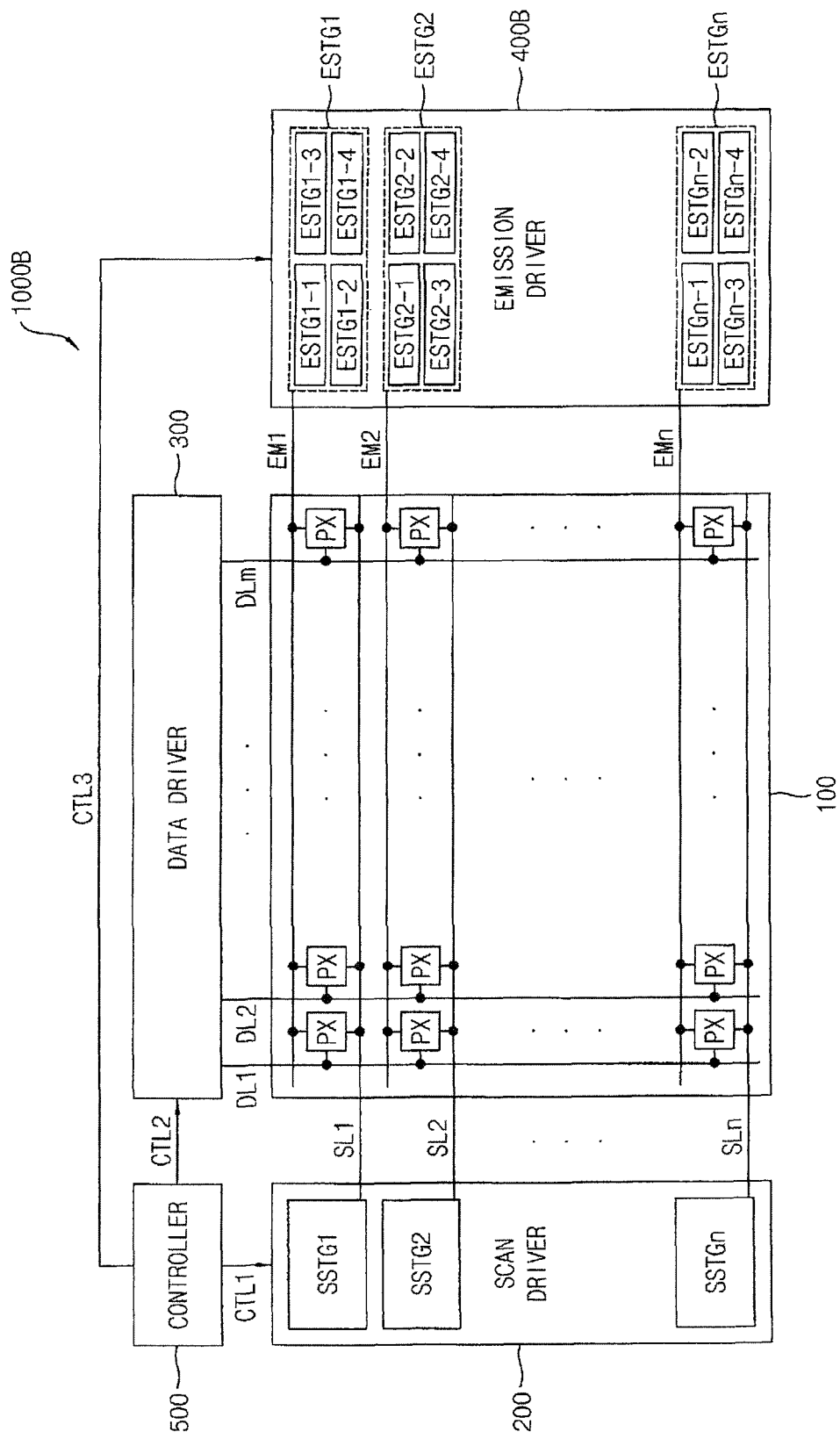
FIG. 12 is a block diagram illustrating an organic light emitting display device according to another example embodiment.
Figure 13:
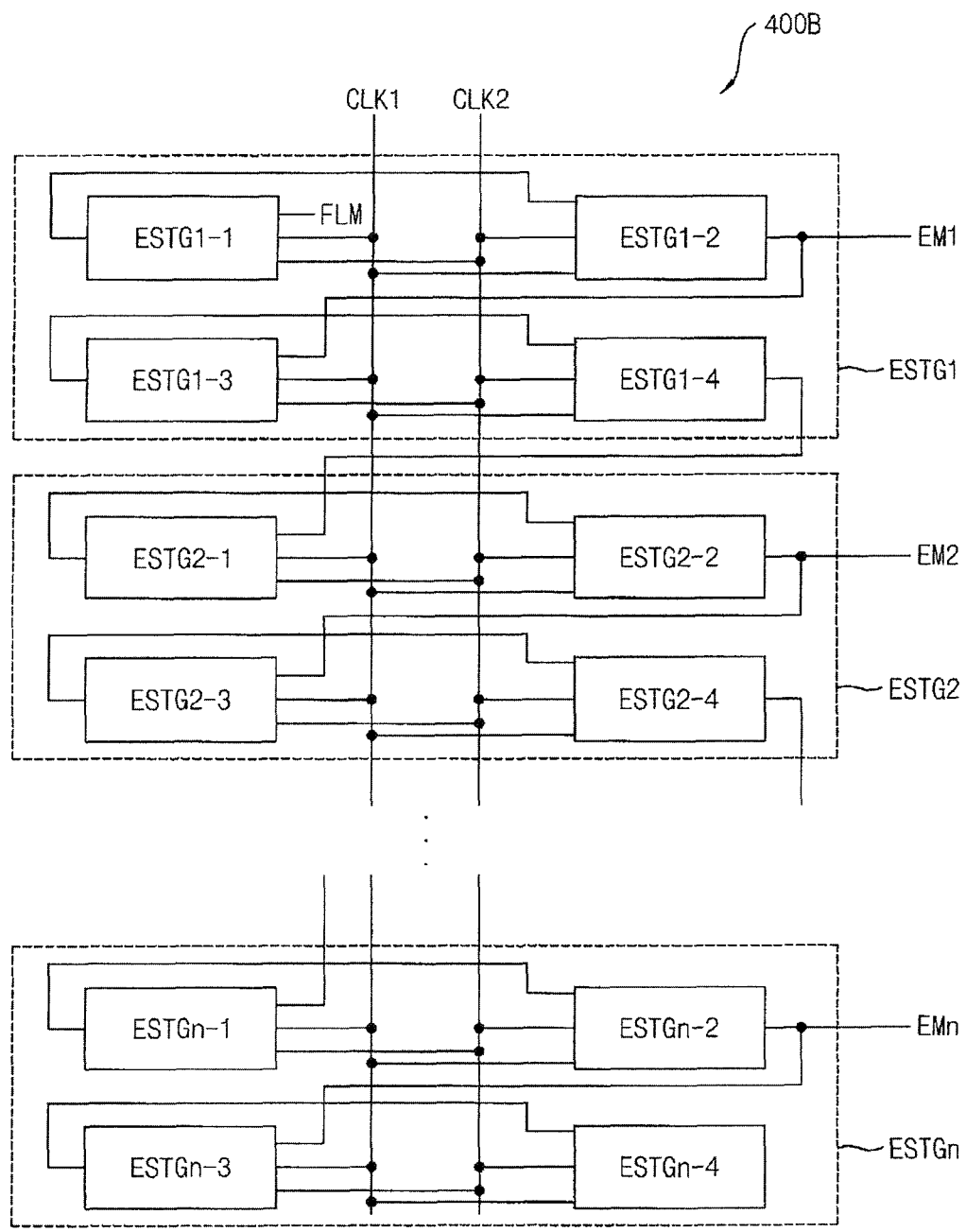
FIG. 13 is a block diagram illustrating one example of the data driver included in the organic light emitting display device of FIG. 12.

FIG. 12 is a block diagram illustrating an organic light emitting display device according to another example embodiment, and FIG. 13 is a block diagram illustrating one example of the data driver included in the organic light emitting display device of FIG. 12.

Referring to FIGS. 12 and 13, the organic light emitting display device 1000B may include a display panel 100, a scan driver 200, a data driver 300, an emission driver 400B, and a controller 500. The organic light emitting display device 1000B according to the present exemplary embodiment is substantially the same as the organic light emitting display device of the exemplary embodiment described in FIG. 1, except that each emission stage includes four sub-stages. Therefore, the same reference numerals will be used to refer to the same or like parts as those described in the previous exemplary embodiment of FIG. 1, and any repetitive explanation concerning the above elements will be omitted.

The display panel 100 may display an image. The display panel 100 may include a plurality of scan lines SL1 through SLn, a plurality of data lines DL1 through DLm, a plurality of emission lines EM1 through EMn, and a plurality of pixels PX.

The scan driver 200 may provide a scan signal to the pixel PX via a respective one of the scan lines SL1 through SLn based on a first control signal CTL1.

The data driver 300 may provide a data signal to the pixel PX via a respective one of the data lines DL1 through DLm based on a second control signal CTL2.

The emission driver 400B may include a plurality of emission stages ESTG1 through ESTGn for providing emission signal to the pixels PX via the emission lines EM1 through EMn, respectively. Each of the emission stages ESTG1 through ESTGn may include four sub-stages dependently connected to each other. For example, the first emission stage ESTG1 may include the (1-1)st sub-stage ESTG1-1, the (1-2)nd sub-stage ESTG1-2, the (1-3)rd sub-stage ESTG1-3, and the (1-4)th sub-stage ESTG1-4.

Each sub-stage may receive either an emission start signal FLM or an output signal of a previous sub-stage as an input signal, and may also receive a first voltage VGL, a second voltage VGH that is higher than the first voltage VGL, a first emission clock signal CLK1, and a second emission clock signal CLK2. For example, the (1-1)st sub-stage ESTG1-1 may receive the emission start signal FLM as the input signal, and the remaining sub-stages may receive the output signal of a previous sub-stage as the input signal.

All sub-stages may be dependently connected to each other, and may be driven sequentially. For example, an output signal of the (1-1)st sub-stage ESTG1-1 of the first emission stage ESTG1 may be provided to the (1-2)nd sub-stage ESTG1-2. An output signal of the (1-2)nd sub-stage ESTG1-2 may be provided to the (1-3)rd sub-stage ESTG1-3. An output signal of the (1-3)rd sub-stage ESTG1-3 may be provided to the (1-4)th sub-stage ESTG1-4. An output signal of the (1-4)th sub-stage ESTG1-4 may be provided to the (2-1)st sub-stage ESTG2-1 of a subsequent emission stage ESTG2.

One of the sub-stages included in one emission stage ESTGk may output the emission signal to the emission line EMk. For example, the (1-2)nd sub-stage ESTG1-2 and the (2-2)nd sub-stage ESTG2-2 (i.e., second sub-stages of each of the first and second emission stages ESTG1 and ESTG2) may output the emission signal to the first emission line EM1 and the second emission line EM2, respectively.

In one example embodiment, the sub-stages may be located opposite to each other on the basis of an emission clock line via which the emission clock signal is provided. For example, the (1-1)st sub-stage ESTG1-1 may be located opposite to the (1-2)nd sub-stage ESTG1-2 on the basis of the emission clock line. When sub-stages share the emission clock line, and when the sub-stages are located opposite to each other with respect to the emission clock line, the emission driver 400B can be implemented in a relatively small space.

The controller 500 may control the scan driver 200, the data driver 300, and the emission driver 400B. The controller 500 may set a period of the emission clock signals to be shorter than a period of the scan clock signals based on the number of sub-stages included in one emission stage to minutely adjust the dimming level. In one example embodiment, each emission stage may include four sub-stages, and a period of the first scan clock signal may be four times longer than a period of the first emission clock signal.

Therefore, the emission driver 400B may include four sub-stages in one emission stage corresponding to one pixel row, and may set the period of the emission clock signal to a half horizontal period, thereby increasing a resolution of the emission signal and minutely adjusting the dimming level.

Although the example embodiments describe that the emission driver as being configured to receive two emission clock signals, the structure of the emission driver is not limited thereto.

The present inventive concept may be applied to an electronic device having the organic light emitting display device. For example, the present inventive concept may be applied to a cellular phone, a smart phone, a smart pad, a personal digital assistant (PDA), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims and their equivalents. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. An organic light emitting display device comprising:
   a display panel comprising a plurality of scan lines, a plurality of data lines, a plurality of emission lines, and a plurality of pixels;
   a scan driver configured to provide a scan signal to the pixels via the scan lines;
   a data driver configured to provide a data signal to the pixels via the data lines;
   an emission driver comprising a plurality of emission stages for providing an emission signal to the pixels via the emission lines; and
   a controller configured to control the scan driver, the data driver, and the emission driver,
   wherein each of the emission stages comprises a plurality of sub-stages dependently connected to each other,
   wherein one of the sub-stages is configured to output the emission signal to one of the emission lines,
   wherein the controller is configured to provide a plurality of scan clock signals for controlling the scan driver to the scan driver, and to provide a plurality of emission clock signals for controlling the emission driver to the emission driver, and
   wherein a period of the scan clock signals is longer than a period of the emission clock signals.

2. The organic light emitting display device of claim 1, wherein the sub-stages comprise:
   first and second sub-stages each configured to provide an output signal, which is generated by shifting a corresponding input signal to be synchronized with a first emission clock signal of the emission clock signals or a second emission clock signal of the emission clock signals, to a next sub-stage, and
   wherein one of the first and second sub-stages is configured to output the output signal as the emission signal to one of the emission lines.

3. The organic light emitting display device of claim 2, wherein the second emission clock signal is substantially the same as the first emission clock signal shifted by a half period of the first emission clock signal.

4. The organic light emitting display device of claim 2, wherein each of the emission stages further comprises:
   an output signal selector configured to select one of the output signal of the first sub-stage and the output signal of the second sub-stage as the emission signal.

5. The organic light emitting display device of claim 2, wherein the first sub-stage is located opposite to the second sub-stage with respect to an emission clock line via which one of the emission clock signals is configured to be provided.

6. The organic light emitting display device of claim 1, wherein the sub-stages comprise:
   first to fourth sub-stages configured to provide an output signal, which is generated by shifting an input signal to be synchronized with a first emission clock signal of the emission clock signals or a second emission clock signal of the emission clock signals, to a corresponding next sub-stage, and
   wherein one of the first to fourth sub-stages is configured to output the output signal as the emission signal to one of the emission lines.

7. The organic light emitting display device of claim 1, wherein the period of the emission clock signals are determined by dividing a period of the scan clock signals by a number of the sub-stages in one of the emission stages.

8. The organic light emitting display device of claim 1, wherein the controller is configured to provide an emission start signal for driving the emission driver to the emission driver.

9. The organic light emitting display device of claim 8, wherein the controller is configured to control a length of an on-period of the emission start signal based on a dimming control value for controlling a dimming level.

10. The organic light emitting display device of claim 9, wherein the length of the on-period of the emission start signal is a multiple of the period of the emission clock signals for controlling the emission driver.

11. The organic light emitting display device of claim 10, wherein a length of the on-period of the emission start signal corresponds to a product of a length of one horizontal period and a number of the scan lines.

12. The organic light emitting display device of claim 9, wherein the dimming control value is configured to be changed based on an external light intensity.

13. The organic light emitting display device of claim 9, wherein the controller is configured to provide a hybrid dimming signal to the data driver based on the dimming control value, and
wherein the data driver is configured to select one among a plurality of gamma reference voltage sets based on the hybrid dimming signal to convert image data into the data signal.

14. The organic light emitting display device of claim 1, wherein the emission signal comprises at least one of an on-period and an off-period during one frame period.

15. A panel driver comprising:
a scan driver configured to output a scan signal to scan lines;
an emission driver comprising:
a plurality of emission stages configured to output an emission signal to a plurality of emission lines; and
a controller configured to control the scan driver and the emission driver,
wherein each of the emission stages comprises a plurality of sub-stages dependently connected to each other,
wherein one of the sub-stages is configured to output the emission signal to a corresponding one of the emission lines,
wherein the controller is configured to provide a plurality of scan clock signals for controlling the scan driver to the scan driver, and to provide a plurality of emission clock signals for controlling the emission driver to the emission driver, and
wherein a period of the scan clock signals is longer than a period of the emission clock signals.

16. The panel driver of claim 15, wherein each of the sub-stages is configured to provide an output signal, which is generated by shifting an input signal to be synchronized with a first emission clock signal of the emission clock signals or a second emission clock signal of the emission clock signals, to a next sub-stage, and
wherein one of the sub-stages is configured to output the output signal as the emission signal to one of the emission lines.

17. The panel driver of claim 16, wherein the input signal is an emission start signal or an output signal of a previous sub-stage, and
wherein a length of an on-period of the emission start signal is configured to be adjusted based on a dimming control value for controlling a dimming level.

18. The panel driver of claim 17, wherein the length of the on-period of the emission start signal is a multiple of a period of the first emission clock signal.

19. The panel driver of claim 16, wherein a length of a period of the first emission clock signal and a length of a period of the second emission clock signal are substantially the same as a length of one horizontal period.

* * * * *